United States Patent [19]

Misawa

[11] 4,308,471
[45] Dec. 29, 1981

[54] PRODUCT CIRCUIT

[75] Inventor: Akira Misawa, Tokyo, Japan

[73] Assignee: Pioneer Electronic Corporation, Tokyo, Japan

[21] Appl. No.: 83,707

[22] Filed: Oct. 11, 1979

[30] Foreign Application Priority Data

Oct. 13, 1978 [JP] Japan .................. 53/126619

[51] Int. Cl.³ .................. G06G 7/12; G06G 7/16
[52] U.S. Cl. .................. 307/492; 307/498; 328/160
[58] Field of Search ............... 328/160; 307/229, 492, 307/498; 330/253; 235/190

[56] References Cited

U.S. PATENT DOCUMENTS

3,432,650  3/1969  Thompson .................. 328/160
3,668,440  6/1972  Davis et al. .................. 328/160

Primary Examiner—Stanley D. Miller, Jr.
Assistant Examiner—B. P. Davis
Attorney, Agent, or Firm—Sughrue, Mion, Zinn, Macpeak & Seas

[57] ABSTRACT

A product or multiplier circuit for use in an FM quadrature detector including a double-balanced differential amplifier having resistors disposed in the emitter circuits thereof. Product signals formed at collector junctions of the differential amplifier are amplified by a differential amplifier transistor pair having its emitter circuits fed by a current source and its collector circuits coupled to a current mirror circuit. By restricting the resistance values of the emitter circuit resistors of the double-balanced differential amplifier within a disclosed range, the distortion factor and signal-to-noise ratio of the circuit are improved.

7 Claims, 1 Drawing Figure

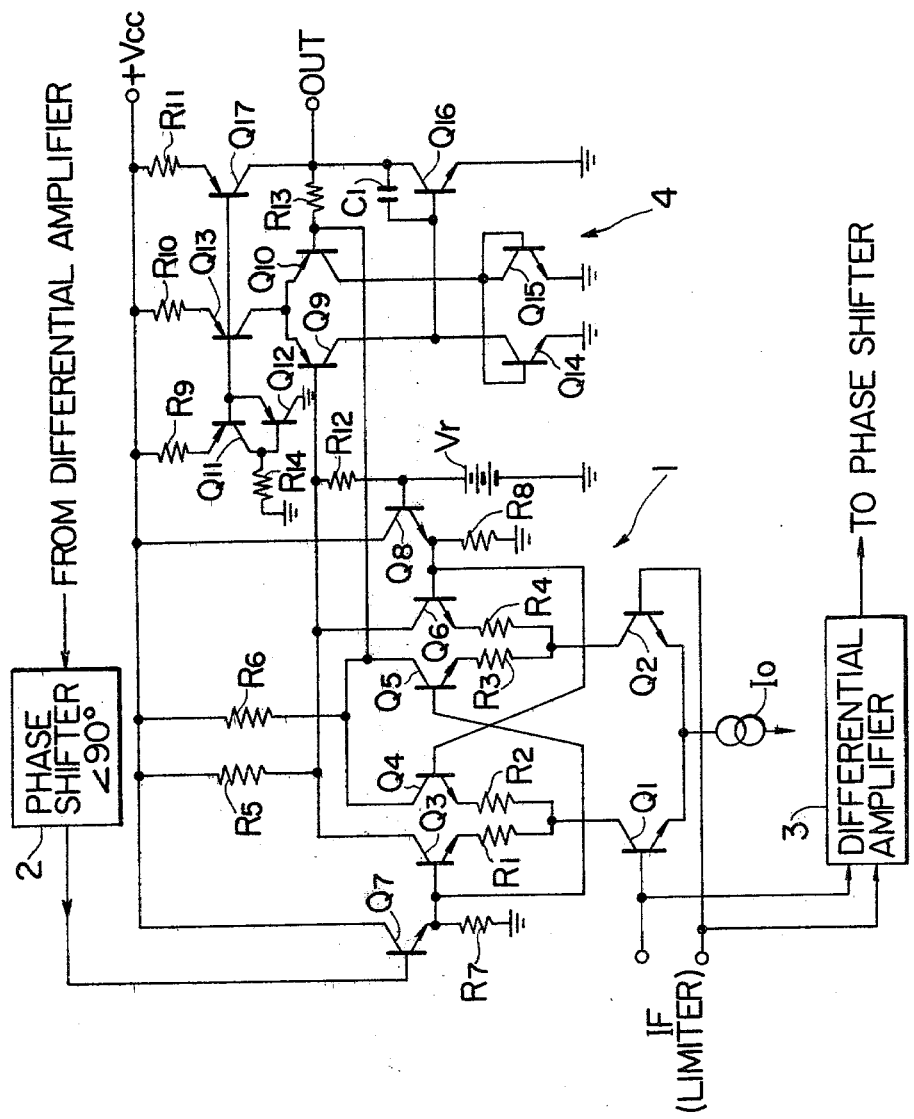

PRODUCT CIRCUIT

BACKGROUND OF THE INVENTION

The invention relates to a product (multiplier) circuit and more particularly to a product circuit such as used in an FM quadrature detector.

Among various types of FM detectors, quadrature detectors have been extensively employed because as they are suitable for implementation on an IC chip and hence desirable in terms of their cost. Such a quadrature detector includes a double-balanced type differential amplifier. A product signal output obtained from the differential amplifier is amplified by a post amplifier and thereafter delivered to a low-pass filter.

Fundamental performance properties of an FM receiver such as the S/N ratio and the distortion are primarily determined by the characteristics of the desired FM detector stage. Accordingly, it has long been desired that the S/N ratio in the double-balanced type differential amplifier of the product detector section be improved.

Accordingly, an object of this invention is to provide an improved product circuit particularly suited for use in a quadrature FM detector which provides an improvement in the S/N ratio whereby fundamental performance properties of the FM receiver are improved.

SUMMARY OF THE INVENTION

In accordance with the objects of the invention, there is provided a product circuit for producing a product signal output of a first signal and a second signal including a first differential circuit having first and second transistors with the emitters of both coupled together with a first signal applied to the bases of both, a second differential circuit including third and fourth transistors with the emitters of the third and fourth transistors coupled through respective first and second resistors to the collector of the first transistor with a second signal applied to the base of the third transistor and a fixed bias voltage applied to the base of the fourth transistor, and a third differential circuit including fifth and sixth transistors with the emitters of the fifth and sixth transistors connected through respective third and fourth resistors to the collector of the second transistor with the second signal applied to the base of the fifth transistor and the fixed bias voltage applied to the base of the sixth transistor. With this circuit construction, the product signal is produced between the collector juncture point of the third and sixth transistors and the collector juncture point of the fourth and fifth transistors.

As used in an FM receiver, the first signal will be an FM detected signal, specifically the IF signal, while the second signal is formed by retarding the phase by substantially 90° of the first signal.

A post amplifier circuit can be provided to receive and amplify the product signal. Such a post amplifier, in accordance with the invention, includes a fourth differential circuit including seventh and eighth transistors having the bases thereof coupled respectively to the collector juncture point of the third and sixth transistors and the collector juncture point of the fourth and fifth transistors. The emitters of the seventh and eighth transistors are coupled to each other and to a current source. A current mirror circuit is also provided which includes ninth and tenth transistors of an opposite conductivity type from the seventh and eighth transistors with the collectors of the seventh and eighth transistors coupled respectively to the collectors of the ninth and tenth transistors. An output amplifier transistor produces the final output signal. The base of the output amplifier transistor is coupled to the collector of the ninth transistor. Preferably, the seventh and eighth transistors are of a PNP conductivity type. Also, it is preferred that the cut-off frequency of the seventh and eighth transistors be below the center frequency of the IF signal. The resistance values of the first through fourth resistors are preferrably within a range of 50 Ω to 200 Ω.

BRIEF DESCRIPTION OF THE DRAWING

The single drawing FIGURE is a circuit diagram showing an FM detector according to a preferred embodiment of the invention.

DETAILED DESCRIPTION OF THE PREFERRED EMBODIMENT

The invention will now be described with reference to the accompanying drawings.

The single drawing is a circuit diagram of an FM detector according to a preferred embodiment of the invention. Reference numeral 1 designates a product detector section including a double-balanced type differential amplifier. First and second transistors $Q_1$ and $Q_2$ constitutes a differential amplifier in which an intermediate frequency (IF) signal which has been subjected to amplitude limitation is applied across the bases of the first and second transistors $Q_1$ and $Q_2$. The emitters of the first and second transistors $Q_1$ and $Q_2$ are commonly connected to each other, and a constant current source $I_0$ is connected to the commonly connected emitters. The collector of the first transistor $Q_1$ is connected to the emitters of both third and fourth transistors $Q_3$ and $Q_4$ through emitter resistors $R_1$ and $R_2$, respectively. The collector of the second transistor $Q_2$ is connected to the emitters of fifth and sixth transistors $Q_5$ and $Q_6$ through emitter resistors $R_3$ and $R_4$, respectively. The bases of the fourth and sixth transistors $Q_4$ and $Q_6$ are commonly connected to each other, and to the commonly connected bases thereof a bias voltage is applied by a transistor $Q_8$. The emitter of transistor $Q_8$ is grounded through a resistor $R_8$, and its collector is connected to a positive power source $+V_{cc}$ and its base to a reference voltage $V_r$.

The bases of the third and fifth transistors $Q_3$ and $Q_5$ are commonly connected to each other, and to the commonly connected bases thereof the output signal of a phase shifter 2 is applied through an emitter follower transistor $Q_7$. The emitter follower transistor $Q_7$ has one terminal of a resistor $R_7$ connected to the emitter thereof with the other terminal of the resistor connected to ground. The positive-phase-sequence output of a differential amplifier 3 for amplifying the IF signal is applied to the input of the phase shifter 2. The phase shifter 2 produces an output signal whose phase is retarded by 90° with respect to the phase of the center frequency $f_0(=10.7\text{MHz})$ of the IF signal. The output of the phase shifter 2 varies linearly so that the phase of the output of the phase shifter 2 is in proportion to the variations of the phase of the central frequency $f_0$.

The collectors of the third and sixth transistors $Q_3$ and $Q_6$ are connected through a load resistor $R_5$ to the power source $+V_{cc}$ while the collectors of the fourth and fifth transistors $Q_4$ and $Q_5$ are connected through a load resistor $R_6$ to the power source $+V_{cc}$. A product signal output of the IF signal and the output of the phase shifter 2 is formed between the collector common juncture point of the transistors $Q_3$ and $Q_6$ and the collector common juncture point of the transistors $Q_4$ and $Q_5$.

The product signal output is then coupled to the next stage, specifically, a post amplifier section 4. The post amplifier section is arranged as shown in the FIGURE wherein a pair of PNP transistors $Q_9$ and $Q_{10}$ are coupled as a differential amplifier pair with the product signal output applied to the bases of the respective transistors $Q_9$ and $Q_{10}$. The emitters of the transistors $Q_9$ and $Q_{10}$ are commonly connected to each other and a current source including PNP transistors $Q_{11}$ through $Q_{13}$ and resistors $R_9$, $R_{10}$ and $R_{14}$. The collectors of the transistors $Q_9$ and $Q_{10}$ are connected to active load, that is, a current mirror circuit including NPN transistor $Q_{14}$ and $Q_{15}$. The collector output of the transistor $Q_9$ is applied to the base of an output transistor $Q_{16}$. The emitter of the output transistor $Q_{16}$ is grounded and an amplified output is taken from the collector thereof.

Resistor $R_{11}$ and PNP transistor $Q_{17}$ form a current source together with the PNP transistors $Q_{11}$ and $Q_{12}$. The thus constituted current source functions as an active load of the output transistor $Q_{16}$. An output terminal OUT and the base of the differential transistor $Q_{10}$ (negative-phase-sequence input) are connected through a feedback resistor $R_{13}$ which forms a negative feedback path which acts to improve the distortion factor and S/N ratio of the circuit. The base of the transistor $Q_9$ (positive-phase-sequence input) is connected through a resistor $R_{12}$ to the reference voltage $V_r$. The capacitance $C_1$ provided between the collector and the base of the output transistor $Q_{16}$ is provided for phase sequence compensation.

In the above-described arrangement, the detecting operation per se of the product detector section 1 including the double balanced-type differential amplifier is conventionally known. Therefore, additional operational description thereof is not necessary.

A unique feature of the present invention resides in the provision of the resistors $R_1$ through $R_4$ in the emitter circuits of the differential transistors $Q_3$ through $Q_6$, respectively, which form the second and the third differential circuits. By the provision of these emitter resistors, the S/N ratio of the circuit is increased by approximately 3 decibels in comparison with the conventional circuit construction.

With emitter resistor values of 100 Ω, it has been confirmed experimentally that the S/N ratio of the circuit is increased from 88 dB to 91 dB. It is preferable that the emitter resistors be selected from the range of about 50 Ω to 200 Ω. If the values of the emitter resistors are below about 50 Ω, the described improvement of the S/N ratio is not attained. On the other hand, if the resistances thereof are above 200 Ω, the differential transistors do not effect the necessary switching operations and thus the product detecting function is not performed.

By the use of a post amplifier of the voltage feedback differential amplifer type as illustrated, the distortion factor of the circuit as well as the S/N ratio can be improved. Hence, employment of a post amplifier as illustrated in conjunction with the product detector circuit 4 remarkably improves the characteristics of the FM detector circuit. In addition, with the post amplifier as illustrated constructed with PNP transistors, leakage of the IF carrier signal caused by the switching operation of the differential amplifer in the product detector section 1 is suppressed. To this effect, for an IF carrier frequency of 10.7 MHz, the cut-off frequency $f_T$ of the PNP transistor formed on an IC chip is preferably approximately 10 MHz.

As described above, according to the present invention, the S/N characteristics of the FM receiver are improved by the provision of the resistors in the emitter circuits of the respective differential transistors in the product detector section.

It is apparent that the construction of the post amplifier is not limited to the illustrated construction and that various changes or modifications are possible.

What is claimed is:

1. A product circuit for providing a product signal output of a first signal and a second signal comprising:
   (a) a first differential circuit including first and second transistors, each transistor having an emitter, a collector and a base, the emitters of said first and said second transistors being connected to each other, a first signal being applied to the bases of said first and said second transistors;
   (b) a second differential circuit including third and fourth transistors, each transistor having an emitter, a collector and a base, the emitters of said third and said fourth transistors being connected through respective first and second resistors to the collector of said first transistor, a second signal being applied to the base of said third transistor and a fixed bias voltage being applied to the base of said fourth transistor; and
   (c) a third differential circuit including fifth and sixth transistors, each transistor having an emitter, a collector and a base, the emitters of said fifth and said sixth transistors being connected through respective third and fourth resistors to the collector of said second transistor, said second signal being applied to the base of said fifth transistor and said fixed bias voltage being applied to the base said sixth transistor;
   (d) the resistance values of said first through fourth resistors being in the range of 50 Ω to 200 Ω;
   (e) the collectors of said third and sixth transistors being electrically interconnected at a juncture point, and the collectors of said fourth and fifth transistors being interconnected at a juncture point; whereby said product signal is produced between the collector juncture point of said third and said sixth transistors and the collector juncture point of said fourth and said fifth transistors.

2. The product circuit as defined in claim 1 wherein said first signal is an FM signal, and further comprising means for retarding the phase of said second signal by substantially 90° with respect to the phase of said first signal.

3. The product circuit of claim 1 further comprising a post amplifier circuit coupled to receive and amplify said product signal.

4. A product circuit for providing a product signal output of a first signal and a second signal comprising:
   (a) a first differential circuit including first and second transistors, each transistor having an emitter, a collector and a base, the emitters of said first and said second transistors being connected to each other, a first signal being applied to the bases of said first and said second transistors;
   (b) a second differential circuit including third and fourth transistors, each transistor having an emitter, a collector and a base, the emitters of said third and said fourth transistors being connected through respective first and second resistors to the collector of said first transistor, a second signal being applied to the base of said third transistor and a fixed bias voltage being applied to the base of said fourth transistor; and (c) a third differential circuit including fifth and sixth transistors, each transistor having an emitter, a collector and a base, the emitters of said fifth and said sixth transistors being connected through respective third and fourth resistors to the collector of said second transistor, said second signal being applied to the base of said fifth transistor and said fixed bias voltage being applied to the base said sixth transistor;

(d) the collectors of said third and sixth transistors being electrically interconnected at a juncture point, and the collectors of said fourth and fifth transistors being interconnected at a juncture point; whereby said product signal is produced between the collector juncture point of said third and said sixth transistors and the collector juncture point of said fourth and said fifth transistors; and (e) a post amplifier circuit coupled to receive and amplify said product signal and comprising:

a fourth differential circuit including seventh and eighth transistors having the bases thereof coupled respectively to said collector juncture point of said third and sixth transistors and said collector juncture point of said fourth and fifth transistors;

a current source, the emitters of said seventh and eighth transistors being coupled to each other and to said current source;

a current mirror circuit including ninth and tenth transistors of an opposite conductivity type from said seventh and eighth transistors, the collectors of said seventh and eighth transistors being coupled respectively to the collectors of said ninth and tenth transistors; and an eleventh transistor forming an output amplifier transistor, the base of said eleventh transistor being coupled to said collector of said ninth transistor.

5. The product circuit of claim 4 wherein said seventh and eighth transistors are of a PNP conductivity type.

6. The product circuit of claim 5 wherein the cutoff frequency of said seventh and eighth transistors is below the center frequency of frequency modulated signals applied to said circuit.

7. The product circuit of any one of claims 4, 5, or 6 wherein the resistance values of said first through fourth resistors are in a range of 50 $\Omega$ to 200 $\Omega$.

* * * * *